(12) United States Patent
Mesples et al.

(10) Patent No.: US 10,274,531 B2
(45) Date of Patent: Apr. 30, 2019

(54) INSULATOR FOR OVERHEAD POWER LINES WITH A PROTECTED LEAKAGE CURRENTS DETECTOR

(71) Applicant: SEDIVER SA, Nanterre (FR)

(72) Inventors: Fabrice Mesples, Bellerive sur Allier (FR); Francois Coulloudon, Paris (FR)

(73) Assignee: SEDIVER, Nanterre (FR)

( * ) Notice: Subject to any disclaimer, the term of this patent is extended or adjusted under 35 U.S.C. 154(b) by 0 days.

(21) Appl. No.: 15/786,017

(22) Filed: Oct. 17, 2017

(65) Prior Publication Data
US 2018/0106846 A1  Apr. 19, 2018

(30) Foreign Application Priority Data
Oct. 18, 2016  (FR) ..................... 16 60093

(51) Int. Cl.
| | | |
|---|---|---|
| H01B 17/00 | (2006.01) |
| G01R 31/02 | (2006.01) |
| G01R 31/08 | (2006.01) |
| G01R 31/12 | (2006.01) |
| H01B 17/56 | (2006.01) |
| H02G 7/00 | (2006.01) |

(52) U.S. Cl.
CPC ......... *G01R 31/025* (2013.01); *G01R 31/085* (2013.01); *G01R 31/1245* (2013.01); *G01R 31/1272* (2013.01); *H01B 17/56* (2013.01); *H02G 7/00* (2013.01)

(58) Field of Classification Search
CPC .......... H02G 7/00; H02G 7/05; G01R 31/025; G01R 31/085; G01R 31/1245; G01R 31/1272; G01R 31/12; H01B 17/00; H01B 17/005; H01B 17/02; H01B 17/04; H01B 17/56

USPC ...... 174/139, 40 R, 650, 137 R, 138 R, 142, 174/144, 152 R, 152 E, 140 CR, 182; 16/2.1, 2.2

See application file for complete search history.

(56) References Cited

U.S. PATENT DOCUMENTS

| | | | | |
|---|---|---|---|---|
| 1,691,330 A | * | 11/1928 | Austin | ................... H01B 17/42 174/139 |
| 1,725,097 A | * | 8/1929 | Naylor | ................... H01B 17/48 174/150 |

(Continued)

FOREIGN PATENT DOCUMENTS

| | | |
|---|---|---|
| CN | 2715164 Y | 8/2005 |
| CN | 204065306 U | 12/2014 |

(Continued)

*Primary Examiner* — Angel R Estrada
(74) *Attorney, Agent, or Firm* — Ware, Fressola, Maguire & Barber LLP

(57) ABSTRACT

An overhead power line insulator comprises a dielectric element (4) having an outside surface forming a skirt (5) with a head extended by a metal attachment fitting (7) for attaching the insulator, and a device for detecting surface leakage current flowing on the dielectric (4), the device comprising a conductive ring (8) that surrounds the fitting (7) and that is in contact with the outside surface of the dielectric (4). An electrically insulating protective element (10) is provided in the form of a collared bushing that surrounds the fitting (7), being interposed between the ring (8) and the fitting (7) and extending radially so as to overlie the ring (8) in order to protect it from environmental pollution.

20 Claims, 2 Drawing Sheets

(56) References Cited

U.S. PATENT DOCUMENTS

| | | | | |
|---|---|---|---|---|
| 2,023,808 | A | | 12/1935 | Hawley |
| 3,848,076 | A | * | 11/1974 | Greber .................. H01B 17/48 |
| | | | | 174/141 R |
| 4,107,455 | A | * | 8/1978 | Richards ................ H01B 17/42 |
| | | | | 174/140 R |
| 4,670,624 | A | | 6/1987 | Decker et al. |
| 5,023,406 | A | * | 6/1991 | Thornley ............... H01B 17/42 |
| | | | | 174/209 |
| 6,215,075 | B1 | * | 4/2001 | Pazdirek ............... H01B 17/12 |
| | | | | 174/178 |
| 8,426,736 | B2 | * | 4/2013 | Hyde .................. H01B 17/525 |
| | | | | 174/139 |
| 8,637,769 | B2 | * | 1/2014 | Denndoerfer ........ H01B 17/325 |
| | | | | 174/73.1 |
| 8,912,437 | B2 | * | 12/2014 | Teng ..................... H01B 17/04 |
| | | | | 174/137 R |

FOREIGN PATENT DOCUMENTS

| | | |
|---|---|---|
| EP | 2 884 292 A1 | 6/2015 |
| JP | 2000-67670 A | 3/2000 |

\* cited by examiner

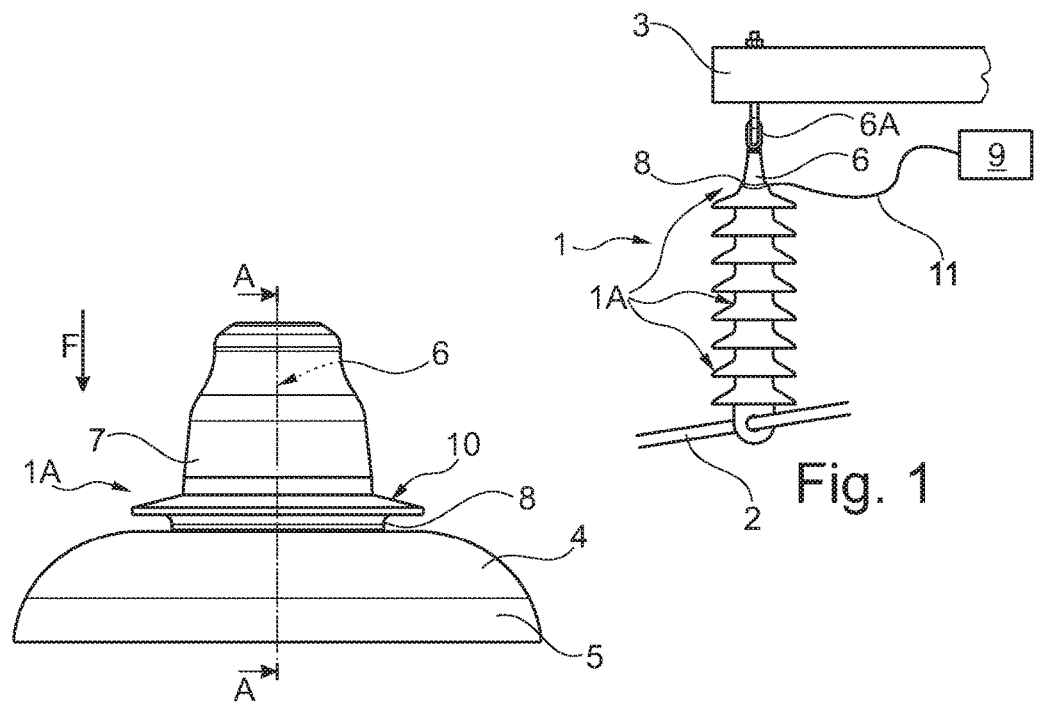
Fig. 1
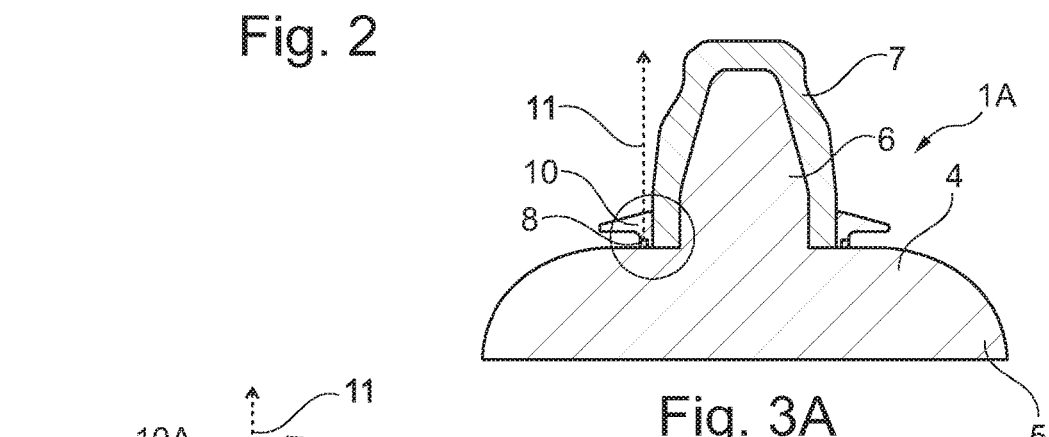
Fig. 2
Fig. 3A
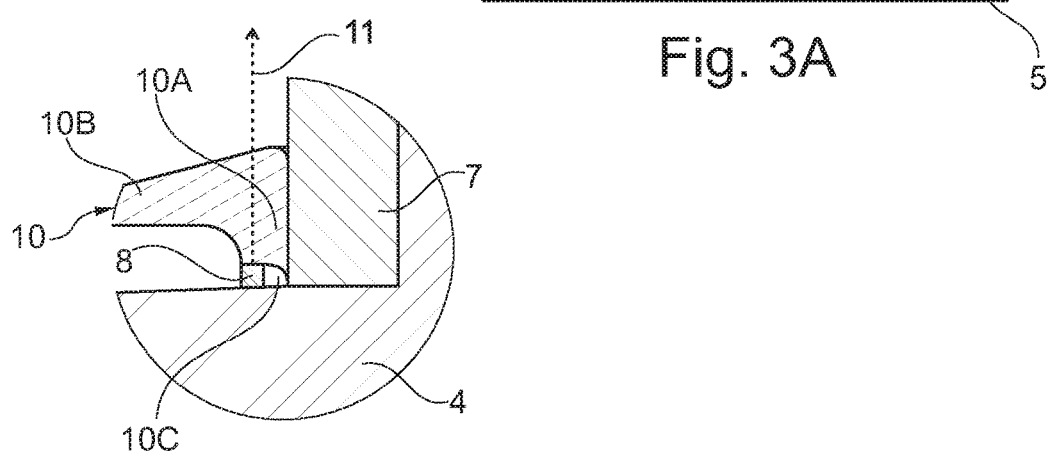
Fig. 3B

INSULATOR FOR OVERHEAD POWER LINES WITH A PROTECTED LEAKAGE CURRENTS DETECTOR

CROSS REFERENCE TO RELATED APPLICATION

This application claims priority under 35 USC § 119 to French Patent Application No. 1660093 filed on Oct. 18, 2016, which application is hereby incorporated by reference in its entirety.

TECHNICAL FIELD

The field of the invention is that of insulators for high and very high voltage power lines.

The invention relates in particular to an insulator for overhead power lines, the insulator comprising both an end dielectric element having an outside surface in the shape of a skirt and extended axially by a metal attachment fitting for attaching the insulator, and also a device for detecting surface leakage electric current flowing on the outside surface of the dielectric element, the device comprising a metal ring electrically in contact with the outside surface of the dielectric element in order to intercept the surface leakage current.

It may be a chain insulator comprising dielectric elements, e.g. made of quenched glass, the insulator being of the cap-and-pin type and the dielectric elements being assembled together to form a chain, or it may be a composite insulator with shed type dielectric elements made of molded synthetic material that are arranged in series around a core made of fiberglass and resin.

The insulator may also be a rigid insulator having a bole with dielectric elements made of porcelain.

Such insulators may be suspended from a pylon in order to support a power line in the air. They may also be used to anchor a power line.

PRIOR ART

It is known that such insulators for overhead power lines are subjected to bad weather, e.g. rain or saline mist, and to air pollution, whether of natural or industrial origin, and that grains of material can become deposited on the outside surfaces of the dielectric elements.

When the layer of dirt becomes moist, it transforms into a conductive electrolyte that can give rise to a surface leakage current flowing on the surface of the insulator.

A high leakage current can lead to loss of electrical insulation.

Thus, the industry seeks to detect and measure surface leakage current on insulators of this type.

Patent document EP 2 884 292 describes a device for detecting surface leakage currents on glass or porcelain chain insulators of the cap-and-pin type.

That device comprises a detector unit that may be mounted on the first dielectric element of cap-and-pin type in the chain.

The detector unit comprises a first metal ring that is fastened around the cap of the first dielectric element and that is in contact with the glass dielectric surface via a metal mesh.

The detector unit also includes a second metal ring for grounding that is fastened around the cap above the first ring, and an electronic measurement unit that is connected to both conductive metal rings in order to detect and measure the leakage current.

That arrangement presents the drawback of likewise being subjected to air pollution and rain, in particular the metal rings that are directly exposed to environmental conditions, e.g. rain.

As a result, the device for detecting and measuring surface leakage currents can present detection and measurement failures.

That is why the manufacturers of overhead power line insulators are seeking to develop insulators that have surface leakage current detector devices that are more reliable.

SUMMARY OF THE INVENTION

The object of the invention is thus to propose an overhead power line insulator having an improved surface leakage current detector device.

To this end, the invention provides an insulator for overhead power lines, the insulator comprising both an end dielectric element having an outside surface in the shape of a skirt and extended axially by a metal attachment fitting for attaching the insulator, and also a device for detecting surface leakage electric current flowing on the outside surface of the dielectric element, the device comprising a metal ring electrically in contact with the outside surface of the dielectric element in order to intercept the surface leakage current, the insulator being characterized in that it further comprises an electrically insulating protective element in the form of a collared bushing, the bushing of the protective element being interposed between the ring and the fitting, and the collar of the protective element extending radially to overlie the ring so as to form a protective umbrella.

The insulator of the invention may present the following features:
- the ring may be adhesively-bonded to the skirt-shaped outside surface of the dielectric element with an electrically conductive adhesive;
- the protective element may be made of ethylene-propylene-diene monomer (EPDM) or of silicone;
- the detector device may comprise a converter for converting the leakage current into voltage;
- the converter may be embedded in the protective element;
- the converter may be embedded in the metal fitting;
- the converter may be remote from the insulator;
- the dielectric element may be made of glass;
- the dielectric element may be made of porcelain;
- the dielectric element may be made of synthetic material;
- the collar of the dielectric element may be frustoconical in shape; and
- the collar of the protective element may have an electric cable that is connected to the ring passing therethrough in leaktight manner.

The idea on which the invention is based thus consists in placing a kind of umbrella above the conductive ring that picks up the surface leakage current in order to protect it from environmental pollution, thereby serving to limit failures of the device to detect and measure surface leakage currents.

As mentioned above, the detection and measurement device comprises a converter for converting the detected leakage currents (a few milliamps) into voltage in order to facilitate analog measurement of the signal.

The protective element of the invention may be seen as a kind of flexible and elastic sleeve that can be engaged by way of example on the metal cap of the first dielectric element in a chain of dielectric elements of the cap-and-pin type.

The protective element can thus be installed initially or it can be retrofitted. Such fitting does not change the length of the leakage line of the chain insulator in significant manner.

BRIEF DESCRIPTION OF THE DRAWINGS

The present invention can be better understood and other advantages appear on reading the following description and from the accompanying drawings, in which:

FIG. 1 is a diagrammatic view of a suspension insulator of the invention of the cap-and-pin type installed on a pylon to support an overhead power line;

FIG. 2 is a diagrammatic view of a cap-and-pin type glass dielectric element fitted with a detector to detect surface leakage current;

FIG. 3A is an axial section view of the FIG. 2 dielectric element;

FIG. 3B is an axial section view showing in greater detail the conductive ring with the protective element in the form of a collared bushing;

DESCRIPTION OF EMBODIMENTS

Figure 4:
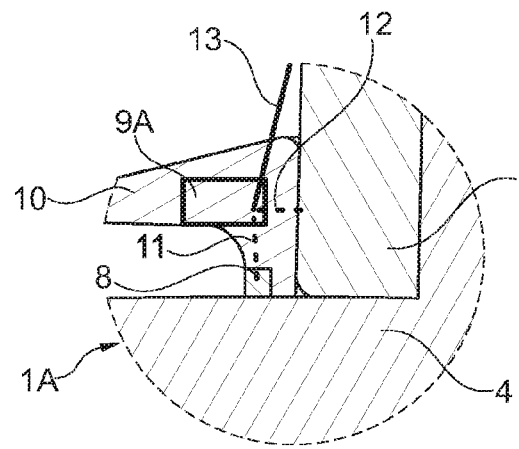
FIG. 4 is a diagram showing a unit for converting leakage current into voltage, which unit is embedded in the protective element which is in the form of a collared bushing.

FIG. 1 is a diagram showing a suspension insulator 1 comprising dielectric elements 1A in series and serving to support a high voltage overhead power line 2 in the air suspended from a pylon 3.

In FIG. 1, the insulator 1 shown comprises a series of eight dielectric elements 1A by way of example.

The dielectric element 1A at the top end of the insulator 1 has a metal ring 8 to pick up the surface leakage current flowing on the surface of the dielectric 1A and an electronic unit 9 for detecting and measuring the residual leakage current, which unit is connected to the ring 8 by an electric cable 11.

The electronic unit 9 may be fastened to the pylon 3, for example.

By way of example, the measurement values can then be transmitted wirelessly from the unit 9 to a remote monitoring station, not shown.

The invention applies to various kinds of overhead power line insulator such as chain insulator of the cap-and-pin type having dielectric elements made of glass or porcelain, or rigid insulators made of porcelain, or indeed composite insulators.

By way of example, FIG. 2 shows only one dielectric element 1A from the end of a chain insulator 1 of the cap-and-pin type, which insulator comprises an insulating portion 4 made of quenched glass having an outside surface that forms a kind of skirt or bell 5 to provide a long leakage line.

The insulating portion 4 presents a hollow head 6 having sealed thereon a metal cap 7 made of galvanized cast iron that is extended axially in this example by a metal attachment fitting 6A of the insulator 1 that is fastened to the pylon 3. In this example, for this end dielectric element 1A, the cap 7 forms part of the attachment fitting 6A.

A pin (not shown) made of galvanized steel is sealed inside the hollow head 6. This pin extends axially along the axis A and is for engaging in the cap 7 of the dielectric element 1A adjacent to the end dielectric element 1A.

FIG. 2 shows the metal ring 8 surrounding the metal cap 7 and protected by a protective element 10 in the form of a collared bushing that forms a kind of protective umbrella for the ring 8.

FIGS. 3A and 3B show the ring 8 with the protective element 10 in greater detail.

As can be seen in these figures, the ring 8 is an electrically conductive metal ring that is placed coaxially about the axis A on the outside surface of the glass insulating portion 4 so as to intercept the surface leakage current that flows at the surface of the glass insulating portion 4.

As can be seen in FIG. 3B, the bushing 10A of the protective element 10 extends axially along the cap 7.

It is interposed at its bottom end between the ring 8 and the cap 7 so that the ring 8 is not electrically in contact with the cap 7.

The collar 10B of the protective element 10 extends radially outwards over the ring 8 so as to form a kind of protective umbrella preventing dirt and moisture becoming deposited on the ring 8.

FIGS. 3A and 3B show the electric cable 11 that connects the ring 8 to the electronic unit 9.

In this example, the ring 8 is square in section, but it could equally well have a section that is rectangular, or the like.

The ring 8 has a flat annular base that is directly in contact with the outside surface of the glass insulating portion 4.

The ring 8 may advantageously be adhesively-bonded to the outside surface of the glass insulating portion 4 while providing electrical conductivity, e.g. by using an epoxy adhesive filled with silver or copper.

The protective element 10 is made of material that is flexible, elastic, and electrically insulating, e.g. out of high temperature vulcanized (HTV) silicone or out of ethylene-propylene-diene monomer (EPDM).

As can be seen in FIG. 3B, the outside circumference of the bottom of the bushing of the protective element 10 presents an angled groove 10C in its outside periphery in which the ring 8 is received.

The ring 8 may be adhesively-bonded in this angled groove 10C.

The plane bottom face of the ring 8 is flush with the base of the bushing 10A of the protective element 10.

The protective element 10 can be engaged on the cap 7 along the arrow F shown in FIG. 2 until its bottom edge comes into abutment against the glass insulating portion 4.

The protective element 10 may preferably be engaged with the ring 8 bonded in the angled groove 10C.

Like the ring 8, the bottom annular edge of the protective element 10 may also be adhesively-bonded to the outside surface of the glass insulating portion 4 in order to prevent water infiltrating from the cap 7 towards the ring 8.

The protective element 10 may equally well be made of a plurality of portions, e.g. with a bushing 10A made up of two semicylindrical portions, that may be put into place separately around the cap 7 and bonded together subsequently.

This arrangement may be advantageous for retrofitting the protective element 10 on an insulator 1 that is already in place on a pylon.

Furthermore, the collar 10B of the protective element 10 is shaped as a truncated cone, as can be seen in FIG. 3B so that the bottom portion of the collar remains dry, and thus insulating, regardless of weather conditions.

In particular, rain water can run naturally under gravity over the top portion of the collar in the form of a truncated cone without reaching the bottom portion of the collar.

FIGS. 3A and 3B show the electric cable 11 going from the ring 8 and passing through the collar 10B of the protective element 10 in order to extend up along the cap 7 and be connected to the remote unit 9.

The hole in the collar 10B through which the electric cable 11 passes is advantageously closed with silicone so that the cable 11 passes through the collar 10B in leaktight manner.

In FIG. 4, the ring 8 is electrically connected to a converter 9A for converting leakage current into voltage. In this example, the converter 9A is embedded in the thickness of the collar 10B of the protective element 10.

The converter 9A is connected to ground by the cable 12 through the metal cap 7, and the voltage signal is conveyed from the converter 9A by the electric cable 13 away from the insulator 1.

Figure 5:
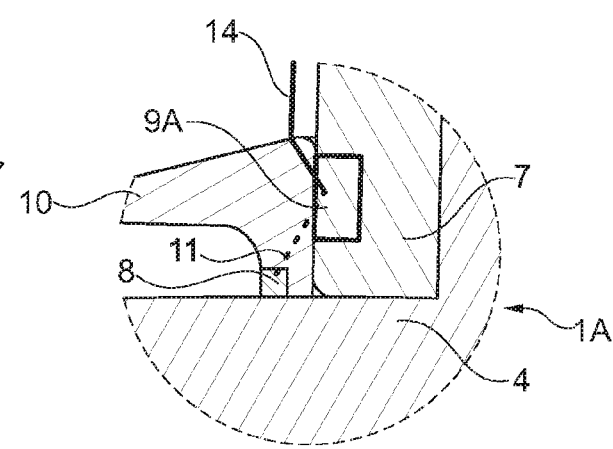
FIG. 5 is a diagram showing a unit for converting leakage current into voltage, which unit is embedded or sunk into the surface of the metal cap of the cap-and-pin type dielectric element, behind the protective element.

In FIG. 5, the converter 9A is sunk into the surface in the cap 7 that is connected to ground and it is covered by the protective element 10. It supplies the voltage signal on the electric cable 14 that passes through the collar 10B of the protective element 10.

Figure 6:
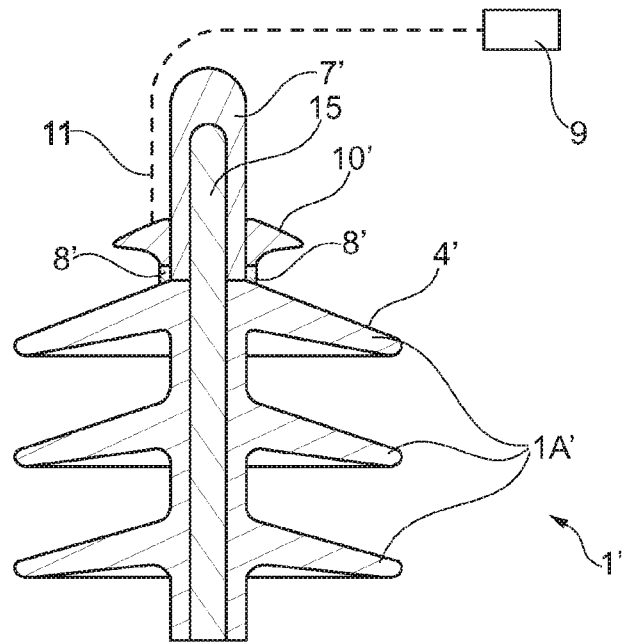
FIG. 6 shows a composite insulator of the invention fitted with a leakage current detector device that is protected by a protective element in the form of a collared bushing.

As mentioned above, the invention also applies to a composite insulator 1' as shown in axial section in FIG. 6.

The composite insulator 1' may also be used to suspend an overhead power line 2.

In this example, the composite insulator 1' comprises a series of dielectric elements 1A' made of synthetic material such as EPDM or of silicone arranged around a rod 15 forming a fiberglass core. These dielectric elements 1A' form sheds along the rod and overall each shed is in the shape of a skirt.

The dielectric elements 1A' may be of the type that is molded directly on the rod 15, or else they may be stacked on the rod 15.

The end dielectric element 1A' is extended by a metal attachment fitting 7' for attachment to a pylon 3, for example. This metal fitting 7' is fastened to the end of the rod 15, in this example.

As can be seen in FIG. 6, the fitting 7' is surrounded at a distance by a metal ring 8' and it is protected by a protective element 10' in the form of a collared bushing of the invention that is analogous in shape to the protective element 10 of FIGS. 2 to 5.

FIG. 6 shows an electronic unit 9 for detecting and measuring a surface leakage signal, which unit is connected by the electric cable 11 to the conductive ring 8.

What is claimed is:

1. An insulator for overhead power lines, the insulator comprising both an end dielectric element having an outside surface in the shape of a skirt and extended axially by a metal attachment fitting for attaching the insulator, and also a device for detecting surface leakage electric current flowing on said outside surface of said dielectric element, the device comprising a metal ring electrically in contact with said outside surface of said dielectric element in order to intercept said surface leakage current, the insulator further comprising an electrically insulating protective element in the form of a bushing with a collar, said bushing of said protective element being interposed between said ring and said fitting, and said collar of said protective element extending radially to overhang said ring so as to form a protective umbrella over said ring.

2. The overhead power line insulator according to claim 1, wherein said ring is adhesively-bonded to said skirt-shaped outside surface of said dielectric element with an electrically conductive adhesive.

3. The overhead power line insulator according to claim 2, wherein said protective element is made of ethylene-propylene-diene monomer or of silicone.

4. The overhead power line insulator according to claim 3, wherein said detector device comprises a converter for converting the leakage current into voltage.

5. The overhead power line insulator according to claim 4, wherein said converter is embedded in said protective element.

6. The overhead power line insulator according to claim 4, wherein said converter is embedded in said metal fitting.

7. The overhead power line insulator according to claim 4, wherein said converter is remote from said insulator.

8. The overhead power line insulator according to claim 7, wherein said dielectric element is made of glass.

9. The overhead power line insulator according to claim 7, wherein said dielectric element is made of porcelain.

10. The overhead power line insulator according to claim 7, wherein said dielectric element is made of synthetic material.

11. The overhead power line insulator according to claim 1, wherein said collar of said dielectric element is frusto-conical in shape.

12. The overhead power line insulator according to claim 1, wherein said collar of said protective element has an electric cable that is connected to said ring passing therethrough in leaktight manner.

13. The overhead power line insulator according to claim 1, wherein said protective element is made of ethylene-propylene-diene monomer or of silicone.

14. The overhead power line insulator according to claim 1, wherein said detector device comprises a converter for converting the leakage current into voltage.

15. The overhead power line insulator according to claim 14, wherein said converter is embedded in said protective element.

16. The overhead power line insulator according to claim 14, wherein said converter is embedded in said metal fitting.

17. The overhead power line insulator according to claim 14, wherein said converter is remote from said insulator.

18. The overhead power line insulator according to claim 1, wherein said dielectric element is made of glass.

19. The overhead power line insulator according to claim 1, wherein said dielectric element is made of porcelain.

20. The overhead power line insulator according to claim 1, wherein said dielectric element is made of synthetic material.

* * * * *